(12) United States Patent
Makino

(10) Patent No.: US 9,007,147 B2
(45) Date of Patent: Apr. 14, 2015

(54) BRANCHING FILTER, AND WIRELESS COMMUNICATION MODULE AND WIRELESS COMMUNICATION DEVICE USING SAME

(75) Inventor: Yutaka Makino, Kirishima (JP)

(73) Assignee: Kyocera Corporation, Kyoto (JP)

( * ) Notice: Subject to any disclaimer, the term of this patent is extended or adjusted under 35 U.S.C. 154(b) by 717 days.

(21) Appl. No.: 13/121,071

(22) PCT Filed: Aug. 31, 2009

(86) PCT No.: PCT/JP2009/065172
§ 371 (c)(1),
(2), (4) Date: Mar. 25, 2011

(87) PCT Pub. No.: WO2010/035611
PCT Pub. Date: Apr. 1, 2010

(65) Prior Publication Data
US 2011/0169588 A1 Jul. 14, 2011

(30) Foreign Application Priority Data
Sep. 26, 2008 (JP) .................. 2008-247332

(51) Int. Cl.
*H01P 1/213* (2006.01)
*H03H 7/00* (2006.01)
(Continued)

(52) U.S. Cl.
CPC .......... *H01P 1/20345* (2013.01); *H01P 1/2135* (2013.01); *H03H 2001/0085* (2013.01)

(58) Field of Classification Search
CPC .............. H01P 1/20345; H01P 1/2135; H03H 2001/0085

USPC ............... 333/26, 32, 33, 134, 202, 204, 333/167–176, 185
See application file for complete search history.

(56) References Cited

U.S. PATENT DOCUMENTS 5,101,181 A * 3/1992 Rauscher ............. 333/134
6,624,723 B2 * 9/2003 Wang ..................... 333/134
(Continued)

FOREIGN PATENT DOCUMENTS

JP        6-6110 A      1/1994
JP        9-260955 A    10/1997
(Continued)

*Primary Examiner* — Benny Lee
*Assistant Examiner* — Rakesh Patel
(74) *Attorney, Agent, or Firm* — Volpe and Koenig, P.C.

(57) ABSTRACT

Provided are a branching filter capable of well branching two electrical signals having a wide frequency band, and a wireless communication module and wireless communication device using same. The branching filter is provided with an input terminal (11), a first output terminal (12a), a second output terminal (12b), a first line conductor (14a) which is electromagnetically coupled to a resonator (13a) of an input stage so as to interconnect the input terminal (11) and the first output terminal (12a), a capacitor (15a) which interconnects the first line conductor (14a) and ground, and a second line conductor (14b) which is electromagnetically coupled to a resonator (13b) of an output stage and is connected to the second output terminal (12b), wherein a low pass filter is configured from the first line conductor (14a) and the capacitor (15a), and a band pass filter is configured from the first line conductor (14a), the second line conductor (14b), and a plurality of resonators. The branching filter eliminates the need for a phase circuit and thus is capable of well branching two signals having a wide frequency band.

3 Claims, 11 Drawing Sheets

(51) Int. Cl.
*H01P 1/203* (2006.01)
*H03H 1/00* (2006.01)

(56) References Cited

U.S. PATENT DOCUMENTS

2004/0046621 A1* 3/2004 Furuya et al. ............... 333/132
2009/0085693 A1* 4/2009 Fukunaga .................... 333/204
2009/0121807 A1* 5/2009 Tomaki et al. ............... 333/185

FOREIGN PATENT DOCUMENTS

| JP | 2000-244208 A | 9/2000 |
| JP | 2002-204105 A | 7/2002 |

* cited by examiner

BRANCHING FILTER, AND WIRELESS COMMUNICATION MODULE AND WIRELESS COMMUNICATION DEVICE USING SAME

TECHNICAL FIELD

The present invention relates to a branching filter, and a wireless communication module and a wireless communication device that incorporate the branching filter, and more particularly to a branching filter capable of demultiplexing two signals having wide frequency bands and a wireless communication module and a wireless communication device that incorporate the branching filter.

BACKGROUND ART

Branching filter capable of demultiplexing electric signals having different frequencies in accordance with the frequencies are widely used for antenna duplexers of communication apparatuses and the like. For example, a branching filter is known that has a configuration in which an input terminal and a first output terminal are connected through a low-pass filter and the input terminal and a second output terminal are connected through a high-pass filter and that has a function of outputting an electric signal having a first frequency band, which is a lower frequency band, from the first output terminal through the low-pass filter and outputting an electric signal having a second frequency band, which is a higher frequency band, from the second output terminal through the high-pass filter (for example, refer to PTL 1). In a conventional branching filter proposed in PTL 1, phase-shift circuits are inserted between the input terminal and the low-pass filter and between the input terminal and the high-pass filter. These phase-shift circuits cause impedance at a time when the second output terminal is viewed from the input terminal and cause impedance at a time when the first output terminal is viewed from the input terminal to be close to infinity in the first frequency band and in the second frequency band, respectively. In doing so, leakage of electric signals having the first frequency band from the second output terminal and leakage of electric signals having the second frequency band from the first output terminal are prevented.

CITATION LIST

Patent Literature

PTL 1: Japanese Unexamined Patent Application Publication No. 2000-244208

SUMMARY OF INVENTION

Technical Problem

However, the conventional branching filter proposed in PTL 1 has a problem in that it has been difficult to obtain wide-band characteristics. That is, as typified by a quarter-wavelength line, the phase-shift circuits included in the conventional branching filter can only shift the phases of electric signals having particular frequencies by a desired value. Therefore, when the first frequency band and the second frequency band are significantly wide, it is difficult to cause the impedance at a time when the second output terminal is viewed from the input terminal to be close to infinity over the entirety of the first frequency band. In addition, it is also difficult to cause the impedance of the first output terminal when viewed from the input terminal to be close to infinity over the entirety of the second frequency band. Therefore, leakage of electric signals having the first frequency band from the second output terminal and leakage of electric signals having the second frequency band from the first output terminal are large, which poses a problem in that the electric signals cannot be properly demultiplexed.

The present invention has been established in view of such a problem in the conventional technology, and an object thereof is to provide a branching filter capable of properly demultiplexing two electric signals having wide frequency bands and a wireless communication module and a wireless communication device that incorporate the branching filter.

Solution to Problem

A branching filter in the present invention includes an input terminal, a first output terminal, a second output terminal, a plurality of resonators that are electromagnetically coupled with each other and that include an input-stage resonator and an output-stage resonator, a first line conductor that is electromagnetically coupled with the input-stage resonator and that connects the input terminal and the first output terminal, a capacitor that connects the first line conductor and ground, and a second line conductor that is electromagnetically coupled with the output-stage resonator and that is connected to the second output terminal. A low-pass filter is composed of the first line conductor and the capacitor, and a band-pass filter having a pass band in a frequency range outside a pass band of the low-pass filter is composed of the first line conductor, the second line conductor, and the plurality of resonators.

According to the branching filter in the present invention having such a configuration, the first line conductor that connects the input terminal and the first output terminal functions as an inductor included in the low-pass filter, as well as functioning as an electric signal input electrode in the band-pass filter that is electromagnetically coupled with the input-stage resonator. Therefore, a branching filter circuit can be formed without using phase-shift circuits, which makes it possible to obtain a branching filter capable of properly demultiplexing two signals having wide frequency bands.

A wireless communication module in the present invention includes an RF unit that includes the branching filter having the above-described configuration and a baseband unit that is connected to the RF unit.

A wireless communication device in the present invention includes an RF unit that includes the branching filter having the above-described configuration, a baseband unit that is connected to the RF unit, and an antenna that is connected to the RF unit.

According to the wireless communication module in the present invention and the wireless communication device in the present invention having such configurations, by using, for demultiplexing of a received signal, the branching filter in the present invention with which leakage of electric signals is small over the entirety of the two wide frequency bands that are used for communication, the attenuation of the received signal that propagates through the branching filter is small. Therefore, a wireless communication module and a wireless communication device that have high reception sensitivities and high performance can be obtained.

It is to be noted that the sentence "a low-pass filter is composed of the first line conductor and the capacitor" means that the first line conductor and the capacitor are components of a low-pass filter and the low-pass filter is formed by using these components. Therefore, needless to say, not only a case in which the low-pass filter is composed of only the first line conductor and the capacitor, but also a case in which the low-pass filter is formed by including another component are included. This holds true for the sentence "a band-pass filter having a pass band in a frequency range outside a pass band of the low-pass filter is composed of the first line conductor, the second line conductor, and the plurality of resonators".

Advantageous Effects of Invention

According to the branching filter in the present invention, a branching filter capable of properly demultiplexing two signals having wide frequency bands can be obtained.

DESCRIPTION OF EMBODIMENTS

A branching filter in the present invention, and a wireless communication module and a wireless communication device that incorporate the branching filter will be described in detail with reference to the attached drawings.

First Embodiment

Figure 1:
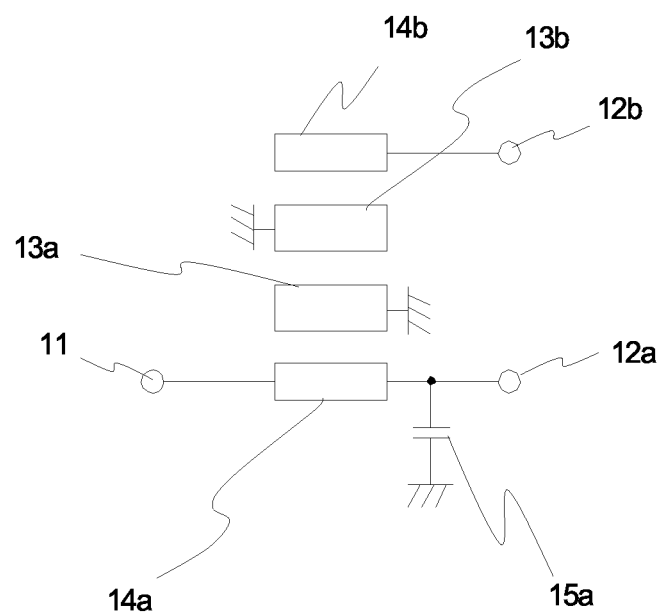
FIG. 1 is a schematic circuit diagram illustrating a branching filter according to a first embodiment of the present invention.

FIG. 1 is a circuit diagram illustrating a branching filter according to a first embodiment of the present invention. As illustrated in FIG. 1, the branching filter according to this embodiment includes an input terminal 11, a first output terminal 12a, a second output terminal 12b, an input-stage resonator 13a, an output-stage resonator 13b, a first line conductor 14a, a capacitor 15a, and a second line conductor 14b. The input-stage resonator 13a and the output-stage resonator 13b are each made of a quarter-wavelength resonator whose one end is grounded, and are electromagnetically coupled with each other. The first line conductor 14a is electromagnetically coupled with the input-stage resonator 13a and connects the input terminal 11 and the first output terminal 12a. The capacitor 15a connects the first line conductor 14a and the ground. The second line conductor 14b is electromagnetically coupled with the output-stage resonator 13b and connected to the second output terminal 12b. The first line conductor 14a and the capacitor 15a together form a low-pass filter. In addition, the first line conductor 14a, the second line conductor 14b, and a plurality of resonators together form a band-pass filter that has a pass band in a frequency range outside the pass band of the low-pass filter.

In the branching filter according to this embodiment having such a configuration, when electric signals are input to the input terminal 11, the low-pass filter composed of the first line conductor 14a and the capacitor 15a attenuates an electric signal on the high-frequency side and an electric signal having a frequency that corresponds to the pass band of the low-pass filter is output from the first output terminal 12a. In addition, when electric signals are input to the input terminal 11, the input-stage resonator 13a, which is electromagnetically coupled with the first line conductor 14a, is excited, and accordingly the input-stage resonator 13a and the output-stage resonator 13b, which are electromagnetically coupled with each other, resonate with each other. The electric signals are then output from the second output terminal 12b through the second line conductor 14b, which is electromagnetically coupled with the output-stage resonator 13b. At this time, an electric signal having a frequency band including a frequency that causes the input-stage resonator 13a and the output-stage resonator 13b to resonate with each other, that is, an electric signal having the pass band of the band-pass filter composed of the first line conductor 14a, the input-stage resonator 13a, the output-stage resonator 13b, and the second line conductor 14b, selectively propagates. Since the pass band of the band-pass filter is set to be located in a frequency range outside the pass band of the low-pass filter, from among electric signals input to the input terminal 11, an electric signal within the pass band of the low-pass filter is output from the first output terminal 12a, and an electric signal within the pass band of the band-pass filter is output from the second output terminal 12b. Thus, the branching filter according to this embodiment functions as a branching filter.

In addition, in the branching filter according to this embodiment, the first line conductor 14a functions as an inductor included in the low-pass filter, as well as functioning as an electric signal input electrode in the band-pass filter that is electromagnetically coupled with the input-stage resonator 13a. Therefore, a branching filter circuit can be formed without using phase-shift circuits and a branching filter capable of properly demultiplexing two signals having wide frequency bands can be obtained.

Second Embodiment

Figure 2:
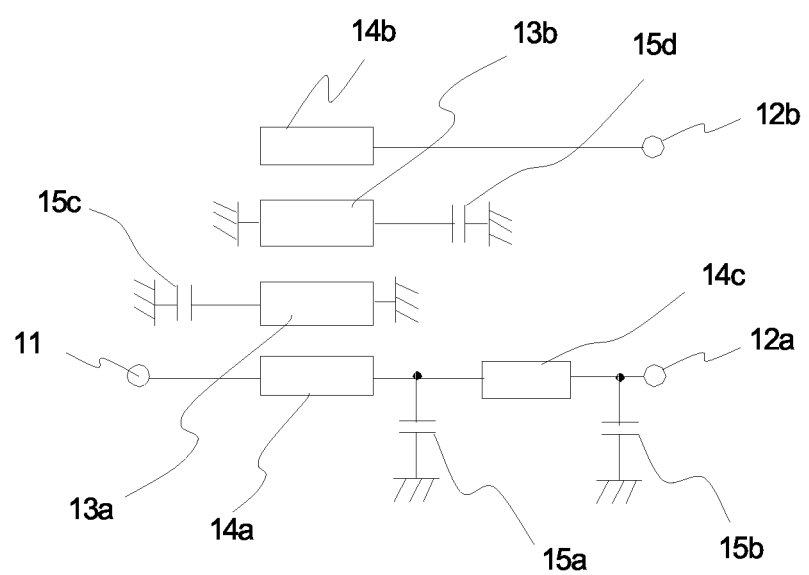
FIG. 2 is a schematic circuit diagram illustrating a branching filter according to a second embodiment of the present invention.

FIG. 2 is a circuit diagram illustrating a branching filter according to a second embodiment of the present invention. It is to be noted that, in this embodiment, only differences from the above-described first embodiment will be described and description of the same components is omitted by using the same reference numerals.

As illustrated in FIG. 2, in the branching filter according to this embodiment, a third line conductor 14c is inserted between the first line conductor 14a and the first output terminal 12a, and a capacitor 15b connects the third line conductor 14c and the ground. In addition, a capacitor 15c connects an open end of the input-stage resonator 13a and the ground, and a capacitor 15d connects an open end of the output-stage resonator 13b and the ground.

In the branching filter according to this embodiment having such a configuration, a low-pass filter that connects the input terminal 11 and the first output terminal 12a is a low-pass filter that has a two-stage configuration including the first line conductor 14a, the capacitor 15a, the third line conductor 14c, and the capacitor 15b. Therefore, the frequency selectivity of the low-pass filter can be improved and accordingly a branching filter having better demultiplexing capabilities can be obtained. In addition, since the open end of the input-stage resonator 13a is connected to the ground through the capacitor 15c and the open end of the output-stage resonator 13b is connected to the ground through the capacitor 15d, the lengths of the input-stage resonator 13a and the output-stage resonator 13b can be reduced. Therefore, a smaller branching filter can be obtained.

Third Embodiment

Figure 3:
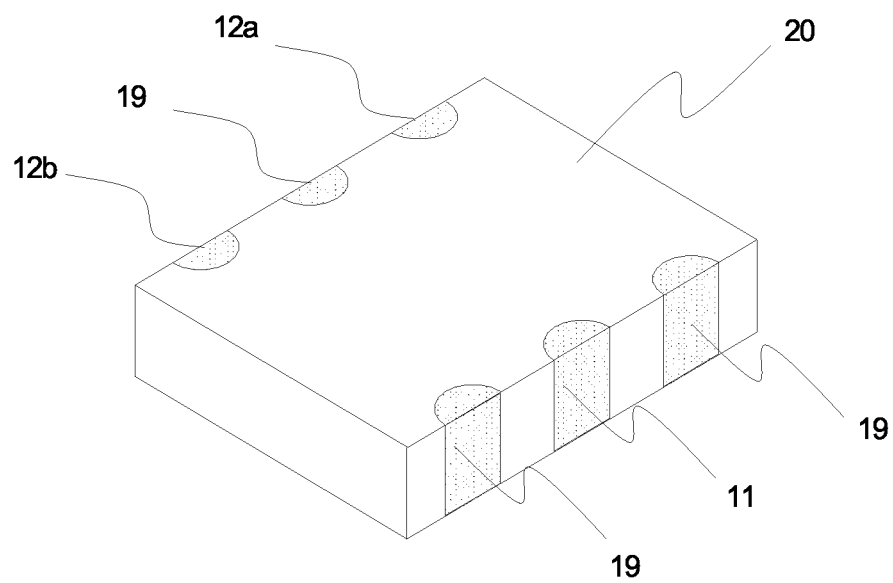
FIG. 3 is a schematic exterior perspective view illustrating a branching filter according to a third embodiment of the present invention.
Figure 4:
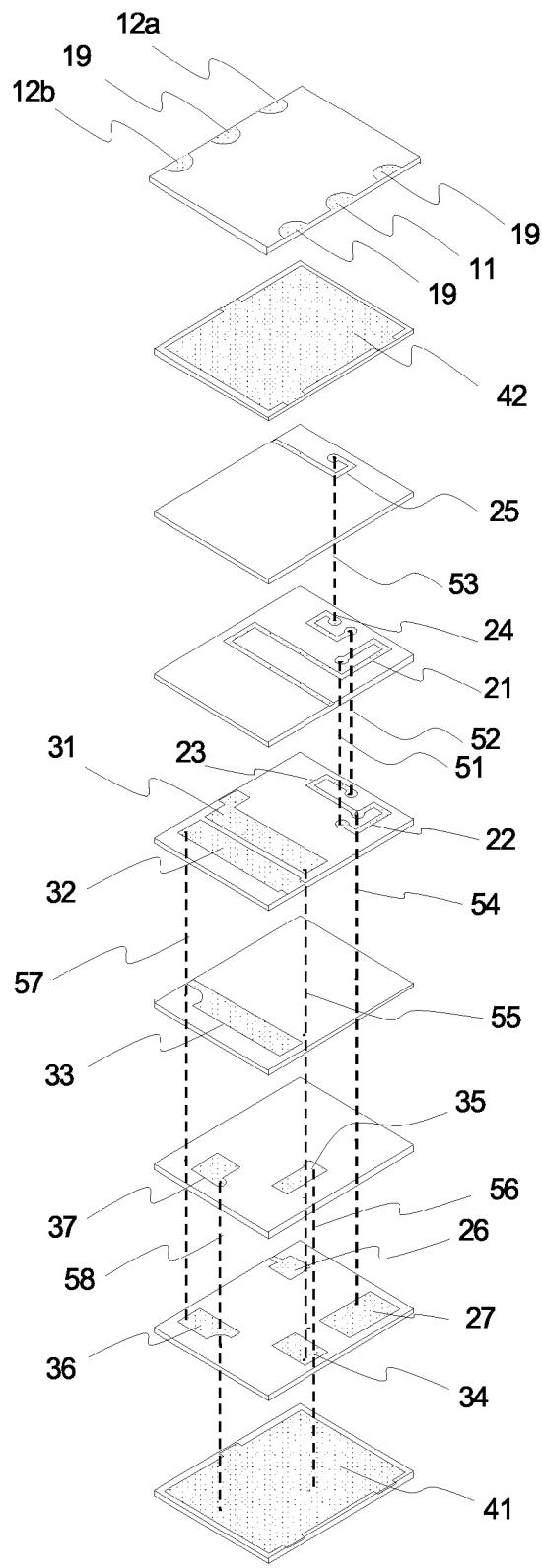
FIG. 4 is an exploded schematic perspective view of the branching filter illustrated in FIG. 3.
Figure 5:
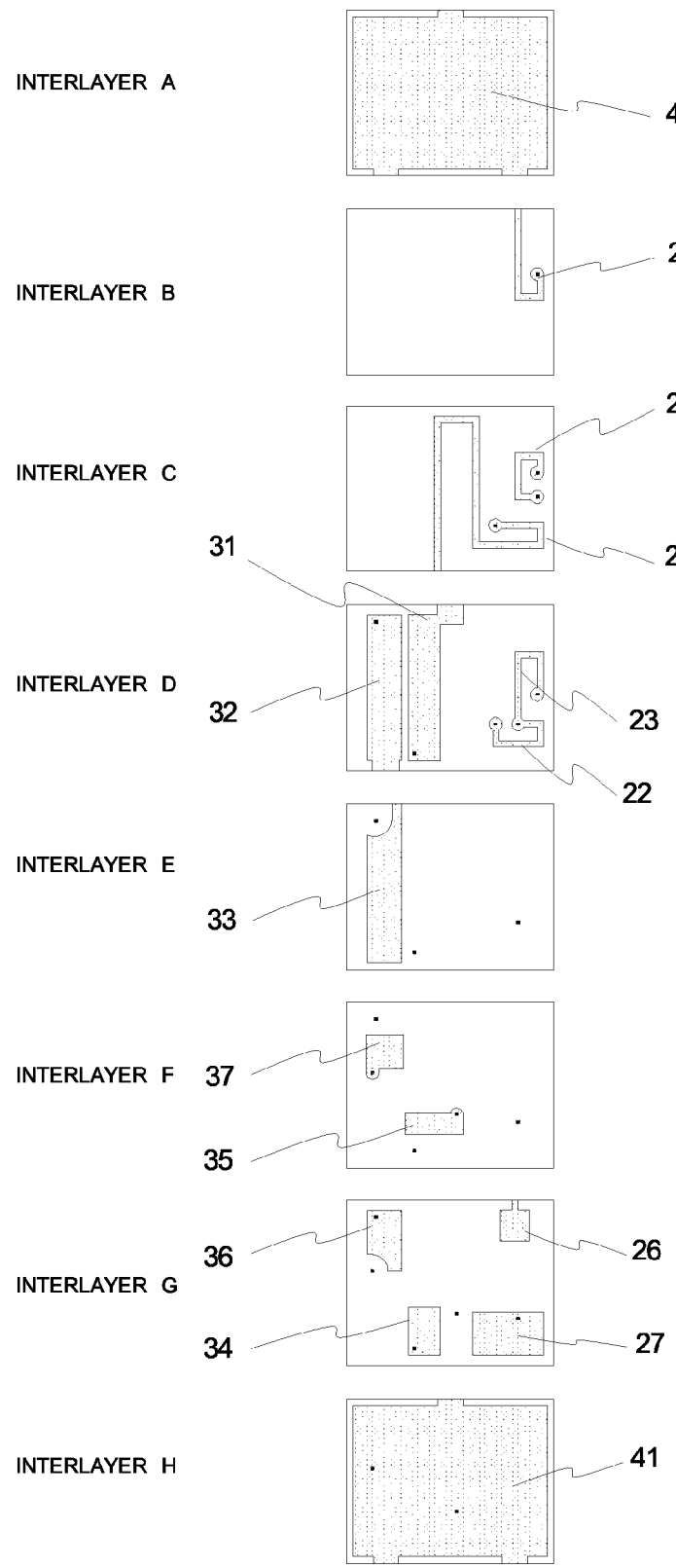
FIG. 5 is a schematic plan view illustrating interlayers of the branching filter illustrated in FIG. 3.

FIG. 3 is a schematic exterior perspective view illustrating a branching filter according to a third embodiment of the present invention. FIG. 4 is an exploded schematic perspective view of the branching filter illustrated in FIG. 3. FIG. 5 is a schematic plan view illustrating interlayers of the branching filter illustrated in FIG. 3. It is to be noted that, in this embodiment, only differences from the above-described second embodiment will be described and description of the same components is omitted by using the same reference numerals.

The branching filter according to this embodiment is such that the branching filter according to the second embodiment, which is illustrated in the circuit diagram of FIG. 2, is configured inside dielectrics. In the branching filter according to this embodiment, as illustrated in FIGS. 3 to 5, various conductors that form the branching filter are arranged inside a layered body 20 composed of a plurality of stacked dielectric layers. On the surface of the layered body 20, terminal electrodes, which are the input terminal 11, the first output terminal 12a, the second output terminal 12b, and ground terminals 19, are arranged. The conductor 42 is arranged on the interlayer A.

In addition, in the branching filter according to this embodiment, a strip conductor 21 whose one end is connected to a terminal electrode, which is the input terminal 11, is arranged on an interlayer C of the layered body 20. The other end of the strip conductor 21 is connected, through a through conductor 51 that penetrates through a dielectric layer, to one end of a strip conductor 22 that is arranged on an interlayer D. The other end of the strip conductor 22 is connected to one end of a strip conductor 23 that is also arranged on the interlayer D. The other end of the strip conductor 23 is connected, through a through conductor 52, to one end of a strip conductor 24 that is arranged on the interlayer C of the interlayer product 20. The other end of the strip conductor 24 is connected, through a through conductor 53, to one end of a strip conductor 25 that is arranged on an interlayer B. The other end of the strip conductor 25 is connected to a terminal electrode, which is the first output terminal 12a. Here, the strip conductor 21, the through conductor 51, and the strip conductor 22 together form the first line conductor 14a illustrated in the circuit diagram of FIG. 2. In addition, the strip conductor 23, the through conductor 52, the strip conductor 24, the through conductor 53, and the strip conductor 25 together form the third line conductor 14c illustrated in the circuit diagram illustrated in FIG. 2. In addition, the other end of the strip conductor 22 is connected, through a through conductor 54, to a capacitance forming conductor 27 that is arranged on an interlayer G. In addition, a grounding conductor 41 connected to the ground terminals 19 is arranged on an interlayer H. The capacitance forming conductor 27 is arranged such that the capacitance forming conductor 27 faces the grounding conductor 41 through a dielectric layer. A portion in which the capacitance forming conductor 27 and the grounding conductor 41 face each other forms the capacitor 15a illustrated in the circuit diagram of FIG. 2. Furthermore, a capacitance forming conductor 26 is arranged on the interlayer G such that the capacitance forming conductor 26 faces the grounding conductor 41 through a dielectric layer, and connected to a terminal electrode, which is the first output terminal 12a. A portion in which the capacitance forming conductor 26 and the grounding conductor 41 face each other forms the capacitor 15b illustrated in the circuit diagram of FIG. 2. The low-pass filter in the circuit diagram of FIG. 2 that connects the input terminal 11 and the first output terminal 12a is thus configured.

Furthermore, in the branching filter according to this embodiment, a resonating conductor 31 is arranged on the interlayer D of the layered body 20 such that the resonating conductor 31 faces and is electromagnetically coupled with the strip conductor 21 through a dielectric layer. One end of the resonating conductor 31 is connected to a terminal electrode, which is one of the ground terminals 19, and the resonating conductor 31 functions as the input-stage resonator 13a illustrated in the equivalent circuit of FIG. 2. In addition, a resonating conductor 32 is arranged on the interlayer D such that the resonating conductor 32 is electromagnetically coupled with the resonating conductor 31 in an interdigital manner. One end of the resonating conductor 32 is connected to a terminal electrode, which is one of the ground terminals 19, and the resonating conductor 32 functions as the output-stage resonator 13b illustrated in the equivalent circuit of FIG. 2. Furthermore, a strip conductor 33 is arranged on an interlayer E such that the strip conductor 33 faces and is electromagnetically coupled with the resonating conductor 32 through a dielectric layer on the broadside in an interdigital manner. One end of the strip conductor 33 is connected to a terminal electrode, which is the second output terminal 12b, and the strip conductor 33 functions as the second line conductor 14b illustrated in the equivalent circuit of FIG. 2. Furthermore, the other end of the resonating conductor 31 is connected, through a through conductor 55, to a capacitance forming conductor 34 that is arranged on the interlayer G. In addition, a capacitance forming conductor 35 that is connected to the grounding conductor 41 through a through conductor 56 is arranged on an interlayer F. The capacitance forming conductor 34 is arranged such that the capacitance forming conductor 34 faces the grounding conductor 41 and the capacitance forming conductor 35 through dielectric layers. Portions in which the capacitance forming conductor 34 and both the grounding conductor 41 and the capacitance forming conductor 35 face each other together form the capacitor 15c illustrated in the equivalent circuit of FIG. 2. Furthermore, the other end of the resonating conductor 32 is connected, through a through conductor 57, to a capacitance forming conductor 36 that is arranged on the interlayer G. In addition, a capacitance forming conductor 37 that is connected to the grounding conductor 41 through a through conductor 58 is arranged on the interlayer F. The capacitance forming conductor 36 is arranged such that the capacitance forming conductor 36 faces the grounding conductor 41 and the capacitance forming conductor 37 through dielectric layers. Portions in which the capacitance forming conductor 36 and both the grounding conductor 41 and the capacitance forming conductor 37 face each other together form the capacitor 15d illustrated in the equivalent circuit of FIG. 2. The band-pass filter in the circuit diagram of FIG. 2 that connects the input terminal 11 and the second output terminal 12b is thus configured.

In the branching filter according to this embodiment having such a configuration, electric signals input to a terminal electrode, which is the input terminal 11, can be demultiplexed in accordance with the frequencies and output from terminal electrodes, which are the first output terminal 12a and the second output terminal 12b. In addition, since the branching filter is configured inside the layered body 20 composed of a plurality of stacked dielectric layers, a small branching filter can be obtained.

Fourth Embodiment

Figure 6:
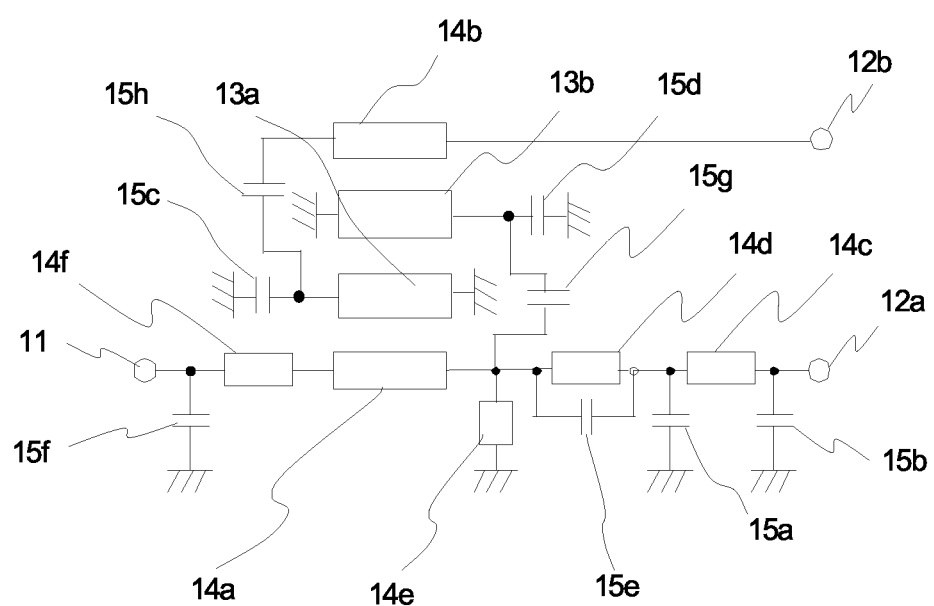
FIG. 6 is a schematic circuit diagram illustrating a branching filter according to a fourth embodiment of the present invention.

FIG. 6 is a circuit diagram illustrating a branching filter according to a fourth embodiment of the present invention. It is to be noted that, in this embodiment, only differences from the above-described second embodiment will be described and description of the same components is omitted by using the same reference numerals.

As illustrated in FIG. 6, in the branching filter according to this embodiment, a fourth line conductor 14d is inserted between the first line conductor 14a and both the third line conductor 14c and the capacitor 15a, and a capacitor 15e is connected parallel to the fourth line conductor 14d. In addition, a fifth line conductor 14e that connects both the first line conductor 14a and the fourth line conductor 14d to the ground is provided. Furthermore, a sixth line conductor 14f is inserted between the input terminal 11 and the first line conductor 14a, and a capacitor 15f that connects both the input terminal 11 and the sixth line conductor 14f to the ground is provided. Furthermore, an end of the first line conductor 14a on the first output terminal 12a side and the open end of the output-stage resonator 13b are connected by a capacitor 15g, and an end of the second line conductor 14b that is not connected to the second output terminal 12b and the open end of the input-stage resonator 13a are connected by a capacitor 15h.

In the branching filter according to this embodiment having such a configuration, the fourth line conductor 14d and the capacitor 15e are inserted between the first line conductor 14a and the third line conductor 14c such that the fourth line conductor 14d and the capacitor 15e are parallel to each other. Therefore, in the transmission characteristics of the low-pass filter, an attenuation pole can be formed at a frequency at which the fourth line conductor 14d and the capacitor 15e generate parallel resonance, which further improves the demultiplexing characteristics of the branching filter. In addition, the sixth line conductor 14f that is inserted between the input terminal 11 and the first line conductor 14a, the capacitor 15f that connects both the input terminal 11 and the sixth line conductor 14f to the ground, and the fifth line conductor 14e that connects both the first line conductor 14a and the fourth line conductor 14d to the ground are provided. Therefore, it is possible to easily set the impedance at a time when the branching filter is viewed from the input terminal 11 to a desired value. Furthermore, the end of the first line conductor 14a on the first output terminal 12a side and the open end of the output-stage resonator 13b are connected by the capacitor 15g, and the end of the second line conductor 14b that is not connected to the second output terminal 12b and the open end of the input-stage resonator 13a are connected by the capacitor 15h. Therefore, an attenuation pole can be formed in the transmission characteristics of the band-pass filter, which further improves the demultiplexing characteristics of the branching filter.

Fifth Embodiment

Figure 7:
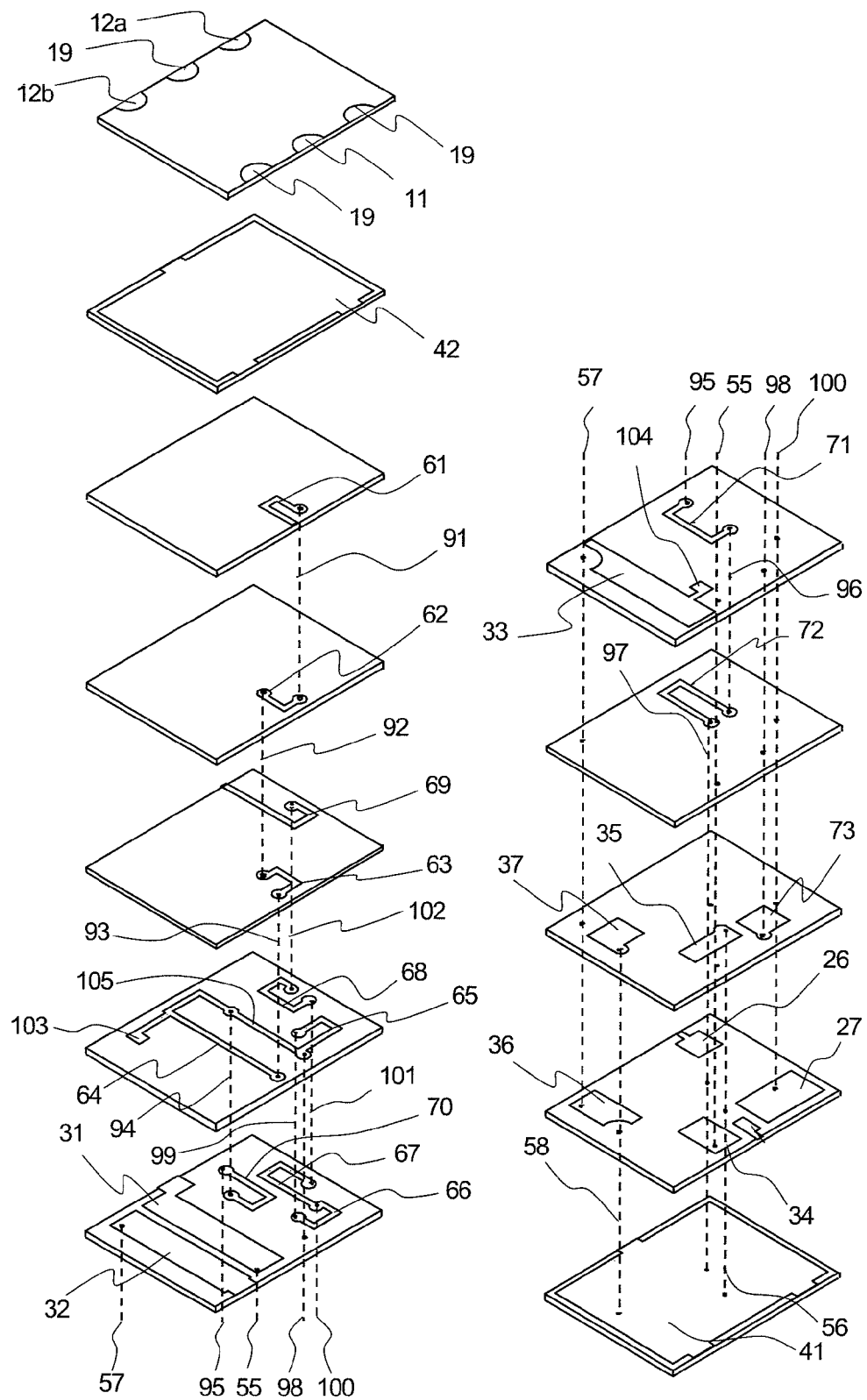
FIG. 7 is an exploded perspective view illustrating a branching filter according to a fifth embodiment of the present invention.
Figure 8:
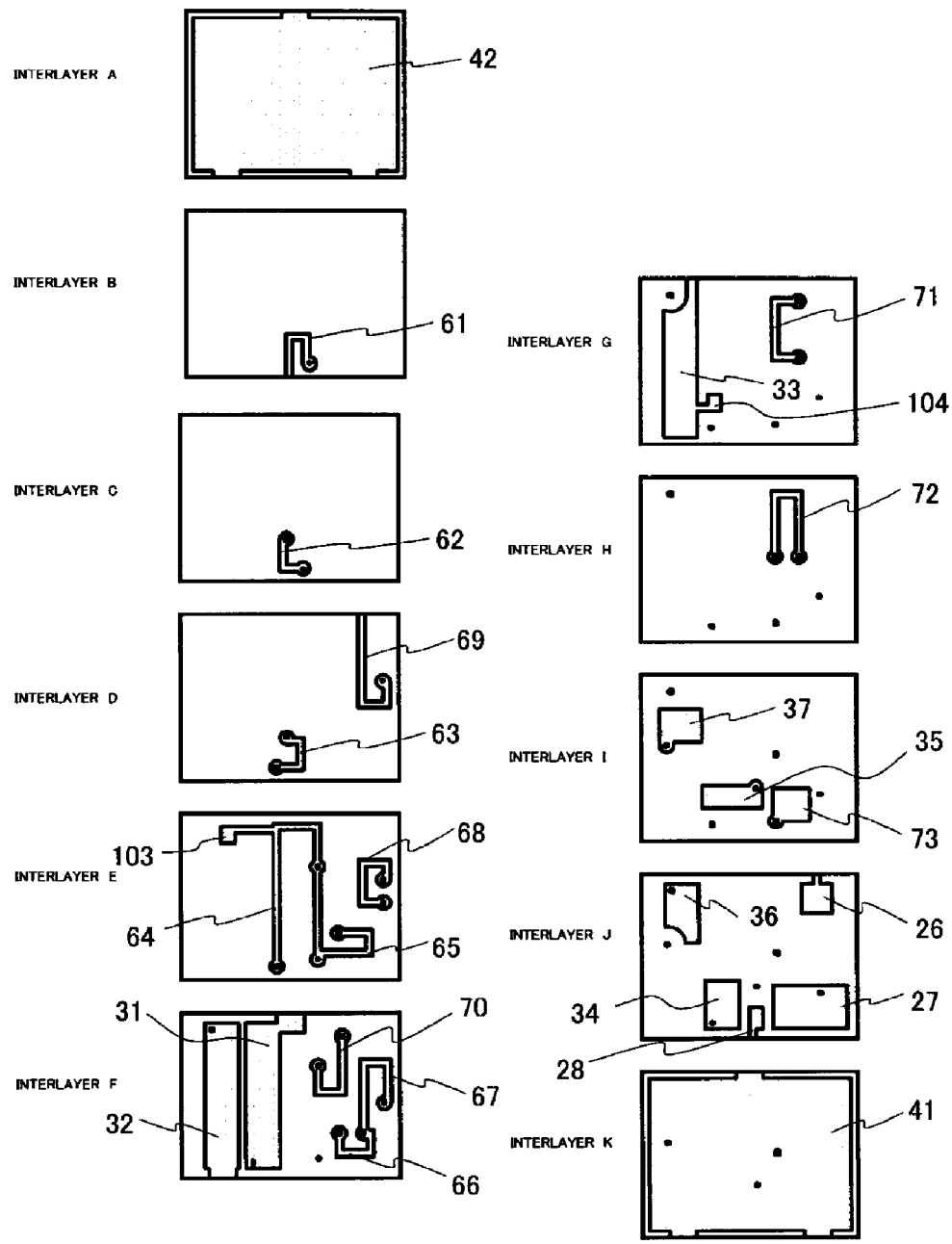
FIG. 8 is a schematic plan view illustrating upper and lower surfaces and interlayers of the branching filter illustrated in FIG. 7.

FIG. 7 is an exploded schematic perspective view illustrating a branching filter according to a fifth embodiment of the present invention. FIG. 8 is a schematic plan view illustrating interlayers of the branching filter illustrated in FIG. 7. It is to be noted that, in this embodiment, only differences from the above-described third embodiment will be described and description of the same components is omitted by using the same reference numerals.

The branching filter according to this embodiment is such that the branching filter according to the fourth embodiment, which is illustrated in the circuit diagram of FIG. 6, is configured inside dielectrics. As illustrated in FIGS. 7 and 8, in the branching filter according to this embodiment, a strip conductor 61 whose one end is connected to a terminal electrode, which is the input terminal 11, is arranged on an interlayer B of a layered body. The conductor 42 is arranged on the interlayer A. The other end of the strip conductor 61 is connected, through a through conductor 91 that penetrates through a dielectric layer, to one end of a strip conductor 62 that is arranged on an interlayer C. The other end of the strip conductor 62 is connected, through a through conductor 92, to one end of a strip conductor 63 that is arranged on an interlayer D. The other end of the strip conductor 63 is connected, through a through conductor 93, to one end of a strip conductor 64 that is arranged on an interlayer E. Here, the strip conductor 61, the through conductor 91, the through conductor 62, the through conductor 92, the strip conductor 63, and the through conductor 93 together form the sixth line conductor 14f illustrated in the circuit diagram of FIG. 6.

In addition, the other end of the strip conductor 64 is connected, through a through conductor 94, to one end of a strip conductor 70 that is arranged on an interlayer F. The other end of the strip conductor 70 is connected, through a through conductor 95, to one end of a strip conductor 71 that is arranged on an interlayer G. The other end of the strip conductor 71 is connected, through a through conductor 96, to one end of a strip conductor 72 that is arranged on an interlayer H. The other end of the strip conductor 72 is connected, through a through conductor 97, to a grounding conductor 41 that is arranged on an interlayer K. Here, the strip conductor 64 forms the first line conductor 14a illustrated in the circuit diagram of FIG. 6. In addition, the through conductor 94, the strip conductor 70, the through conductor 95, the strip conductor 71, the through conductor 96, the strip conductor 72, and the through conductor 97 together form the fifth line conductor 14e illustrated in the circuit diagram of FIG. 6.

Furthermore, the other end of the strip conductor 64 is connected to one end of a strip conductor 105 that is also arranged on the interlayer E. The other end of the strip conductor 105 is connected, through a through conductor 98, to one end of a capacitance forming conductor 73 that is arranged on an interlayer I. The capacitance forming conductor 73 is arranged such that the capacitance forming conductor 73 faces, through a dielectric layer, a capacitance forming conductor 27 that is arranged on an interlayer J. A portion between the capacitance forming conductor 73 and the capacitance forming conductor 27 forms the capacitor 15e illustrated in the circuit diagram of FIG. 6. In addition, the other end of the strip conductor 105 is also connected to one end of a strip conductor 65 that is also arranged on the interlayer E. The other end of the strip conductor 65 is connected, through a through conductor 99, to one end of a strip conductor 66 that is arranged on the interlayer F. The other end of the strip conductor 66 is connected, through a through conductor 100, to the capacitance forming conductor 27 that is arranged on the interlayer J. The capacitance forming conductor 27 is arranged such that the capacitance forming conductor 27 faces, through a dielectric layer, the grounding conductor 41 arranged on the interlayer K. The capacitance forming conductor 27 and the grounding conductor 41 together form the capacitor 15a illustrated in the circuit diagram of FIG. 6. In addition, the strip conductor 65, the through conductor 99, and the strip conductor 66 together form the fourth line conductor 14d illustrated in the circuit diagram of FIG. 6.

Furthermore, the other end of the strip conductor 66 is connected to one end of a strip conductor 67 that is also arranged on the interlayer F. The other end of the strip conductor 67 is connected, through a through conductor 101, to one end of a strip conductor 68 that is arranged on the interlayer E. The other end of the strip conductor 68 is connected, through a through conductor 102, to one end of a strip conductor 69 that is arranged on the interlayer D. The other end of the strip conductor 69 is connected to a terminal electrode, which is the first output terminal 12a. Here, the strip conductor 67, the through conductor 101, the strip conductor 68, the through conductor 102, and the strip conductor 69 together form the third line conductor 14c illustrated in the circuit diagram of FIG. 6. In addition, the capacitance forming conductor 26 is arranged on the interlayer J such that the capacitance forming conductor 26 faces the grounding conductor 41 through a dielectric layer, and connected to a terminal electrode, which is the first output terminal 12a. A portion in which the capacitance forming conductor 26 and the grounding conductor 41 face each other forms the capacitor 15b illustrated in the circuit diagram of FIG. 6. The low-pass filter in the circuit diagram of FIG. 6 that connects the input terminal 11 and the first output terminal 12a is thus configured.

Furthermore, in the branching filter according to this embodiment, a capacitance forming conductor 103 that is connected to the strip conductor 64 is arranged on the interlayer E of the layered body 20 such that the capacitance forming conductor 103 faces, through a dielectric layer, an open end side of a resonating conductor 32 that is arranged on the interlayer F. A portion in which the capacitance forming conductor 103 and the resonating conductor 32 face each other forms the capacitor 15g illustrated in the circuit diagram of FIG. 6. In addition, a capacitance forming conductor 104 that is connected to a strip conductor 33 is arranged on the interlayer G such that the capacitance forming conductor 104 faces, through a dielectric layer, an open end side of a resonating conductor 31 that is arranged on the interlayer F. A portion in which the capacitance forming conductor 104 and the resonating conductor 31 face each other forms the capacitor 15h illustrated in the circuit diagram of FIG. 6.

In the branching filter according to this embodiment having such a configuration, a branching filter having good selectivity and good demultiplexing characteristics is configured inside a layered body composed of a plurality of stacked dielectric layers, the branching filter having attenuation poles outside the pass bands in the transmission characteristics of the low-pass filter and those of the band-pass filter. Therefore, the branching filter according to this embodiment is a small, high-performance branching filter.

Sixth Embodiment

Figure 9:
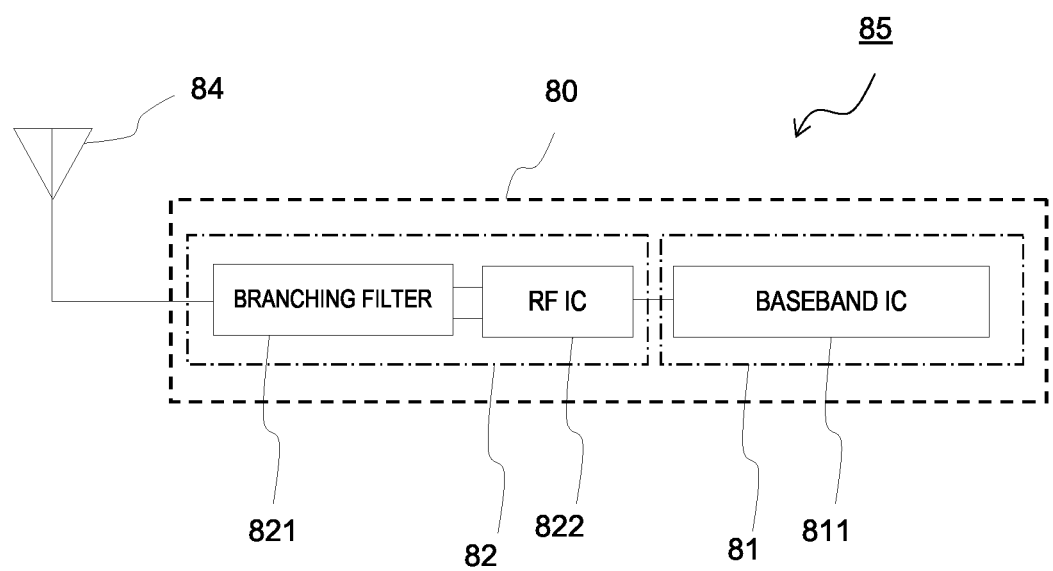
FIG. 9 is a schematic block diagram illustrating a wireless communication module and a wireless communication device according to a sixth embodiment of the present invention.

FIG. 9 is a block diagram illustrating a wireless communication module 80 and a wireless communication device 85 according to a sixth embodiment of the present invention.

The wireless communication module 80 according to this embodiment has a baseband unit 81 in which a baseband signal is processed and an RF unit 82 that is connected to the baseband unit 81 and in which an RF signal, which is a signal obtained after modulation of a baseband signal or before demodulation of a baseband signal, is processed.

The RF unit 82 includes a branching filter 821 having the above-described configuration. A received RF signal is demultiplexed by the branching filter 821.

With respect to the specific configuration, a baseband IC 811 is arranged in the baseband unit 81, and an RF IC 822 is arranged in the RF unit 82 between the branching filter 821 and the baseband unit 81. It is to be noted that another circuit may be inserted between these circuits.

By connecting an antenna 84 to the branching filter 821 of the wireless communication module 80, the wireless communication device 85 in the present invention with which an RF signal is transmitted and received is obtained.

In the wireless communication module 80 and the wireless communication device 85 in the present invention having such a configuration, by using, for demultiplexing of a received signal, the branching filter 821 in the present invention with which leakage of signals is small over the entirety of the frequency band to be used and accordingly isolation is good, the attenuation of a received signal that propagates through the branching filter 821 is reduced and noise is reduced. Therefore, the reception sensitivity is improved and the degree of amplification of a received signal is reduced, thereby reducing the power consumption in an amplifier circuit. Thus, the wireless communication module 80 and the wireless communication device 85 that have high reception sensitivities, low power consumption, and high performance can be obtained.

If the branching filter in the present invention is configured inside the layered body 20 composed of a plurality of stacked dielectric layers as in the case of the branching filters according to the third and fifth embodiments that have been described above, for example, a resin such as an epoxy resin or a ceramic such as a dielectric ceramic can be used for the material of the dielectric layers that form the layered body 20. For example, a glass-ceramic material that is composed of a dielectric ceramic material such as $BaTiO_3$, $Pb_4Fe_2Nb_2O_{12}$, or $TiO_2$ and a glass material such as $B_2O_3$, $SiO_2$, $Al_2O_3$, or ZnO and that can be fired at a relatively low temperature, namely about 800 to 1200° C., can be preferably used. In addition, the thickness of a dielectric layer is set to, for example, 0.01 to 0.1 mm.

In addition, as the materials of the above-described various conductors, terminal electrodes, and through conductors, a conductive material that is mainly composed of Ag or an Ag alloy such as Ag—Pd or Ag—Pt, or a Cu-based, W-based, Mo-based, or Pd-based conductive material can be preferably used. The thickness of each conductor is set to, for example, 0.001 to 0.2 mm.

Furthermore, when the branching filter in the present invention is configured inside the layered body 20 composed of a plurality of stacked dielectric layers, the branching filter can be, for example, fabricated in the following manner. First, slurry is prepared by adding or mixing an appropriate organic solvent or the like to/with a ceramic material powder, and ceramic green sheets are formed by a doctor blade method. Next, through holes for forming the through conductors are formed in the obtained ceramic green sheets by using a punching machine or the like. The through holes are filled with conductive paste containing a conductor such as Ag, Ag—Pd, Au, or Cu, and the same conductive paste is applied to the surfaces of the ceramic green sheets by a printing method, in order to prepare conductive-paste-applied ceramic green sheets. Next, the conductive-paste-applied ceramic green sheets are stacked and press-bonded using a hot pressing apparatus, and then fired at a peak temperature of about 800 to 1050° C. to fabricate the branching filter.

(Modifications)

The present invention is not limited to the first to sixth embodiments that have been described above, and can be modified and improved in various ways, so long as the scope of the present invention is not deviated from.

For example, in the first to fifth embodiments that have been described above, examples in which strip quarter-wavelength resonators are used as the resonators included in the branching filter in the present invention have been described. However, the resonators that are included in the branching filter in the present invention may be ones that are electromagnetically coupled with the first line conductor 14a and excited, and that are electromagnetically coupled with the second line conductor 14b and cause electric signals to be output from the second line conductor 14b. Therefore, for example, line-shaped resonators such as a quarter-wavelength resonator, a half-wavelength resonator, and a ring resonator that use microstrip lines or strip lines may be used. In addition, plane resonators such as a dual-mode square resonator and a dual-mode circle resonator may be used. Furthermore, a dielectric resonator having a cylindrical shape, a rectangular shape, or a ring shape and a three-dimensional resonator such as a concentric resonator may be used.

In addition, as the first line conductor 14a included in the branching filter in the present invention, a line conductor that can be electromagnetically coupled with the input-stage resonator 13a and excited, and that has a certain self-inductance and can form a part of the low-pass filter may be used. In addition, as the second line conductor 14b, a line conductor that can be electromagnetically coupled with the output-stage resonator 13b and can receive an electric signal may be used. Furthermore, as the other line conductors, line conductors that each have a certain self-inductance may be used. Therefore, as these line conductors, for example, strip conductors such as a strip line, a microstrip line, and a coplanar line, and conductors obtained by coating inner walls of hollows in dielectrics, such as a through hole and a via hole, with conductive materials may be preferably used.

Furthermore, although the branching filter in the present invention has a function of outputting, from the first output terminal or the second output terminal, an electric signal that has been input to the input terminal in accordance with the frequencies, the branching filter in the present invention may be, needless to say, used as a multiplexer that multiplexes signals input to the first output terminal and the second output terminal and outputs the multiplexed signals from the input terminal.

EXAMPLES

Next, specific examples of the branching filter in the present invention will be described.

The electric characteristics of the branching filter according to the third embodiment of the present invention, which is illustrated in FIGS. 3 to 5, were calculated by a simulation using a finite element method. With regard to the calculation conditions, the relative dielectric constant of the dielectric layers was 9.45. The thicknesses of various conductors except for the through conductors were 0.01 mm. The widths of the strip conductors and the diameters of the through conductors were 0.1 mm. The total length of the strip conductor 21, the through conductor 51, and the strip conductor 22 that are included in the first line conductor 14a was 7.15 mm. The total length of the strip conductor 23, the through conductor 52, the strip conductor 24, the through conductor 53, and the strip conductor 25 that are included in the third line conductor 14c was 5.7 mm. The resonating conductor 31 had a substantially rectangular shape, where the width thereof was 0.45 mm and the length thereof was 2.2 mm. The resonating conductor 32 had a substantially rectangular shape, where the width thereof was 0.46 mm and the length thereof was 2.35 mm. The strip conductor 33 had a substantially rectangular shape, where the width thereof was 0.5 mm and the length thereof was 2.4 mm. The capacitance forming conductor 26 had a substantially square shape with sides of 0.45 mm. The capacitance forming conductor 27 had a rectangular shape, where the width there of was 0.65 mm and the length thereof was 1.1 mm. The capacitance forming conductor 34 had a rectangular shape, where the width thereof was 1.88 mm and the length thereof was 2.2 mm. The capacitance forming conductor 35 had a substantially rectangular shape, where the width thereof was 0.33 mm and the length thereof was 0.9 mm. The capacitance forming conductor 36 had a substantially rectangular shape, where the width thereof was 0.5 mm and the length thereof was 0.91 mm. The capacitance forming conductor 37 had a substantially rectangular shape, where the width thereof was 0.51 mm and the length thereof was 0.6 mm. The distance between the interlayer F and the interlayer G and that between the interlayer G and the interlayer H (distances between the conductors arranged on the respective interlayers) were both 0.04 mm.

Figure 10:
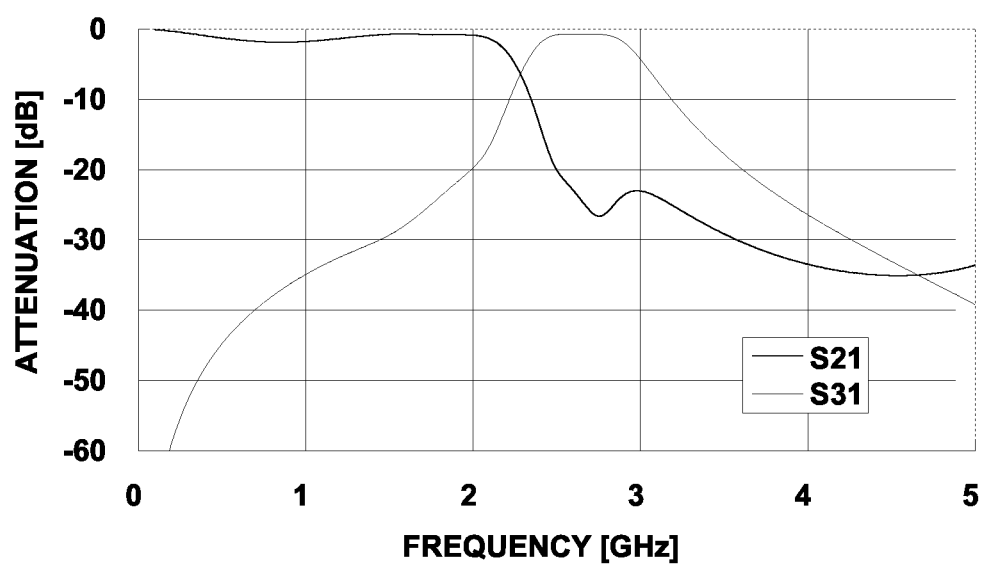
FIG. 10 is a graph illustrating the results of a simulation as to the electric characteristics of the branching filter according to the third embodiment of the present invention.

FIG. 10 is a graph illustrating the results of the simulation. In the graph, where the horizontal axis represents the frequency and the vertical axis represents the attenuation, transmission characteristics (S21 and S31) of the branching filter at a time when the input terminal 11 is used as Port 1, the first output terminal 12a is used as Port 2, and a third output terminal is used as Port 3 are illustrated. According to the graph of FIG. 10, low-loss transmission characteristics could be obtained over the entirety of each of the two wide pass bands, whose fractional bandwidths exceeded 20%, and sufficient attenuation that exceeded −20 dB could be obtained at frequencies corresponding to the other pass band. Therefore, it can be seen that good demultiplexing characteristics could be obtained where leakage of signals into the other pass band was suppressed over the entirety of each wide pass band, which confirms the effectiveness of the present invention.

Figure 11:
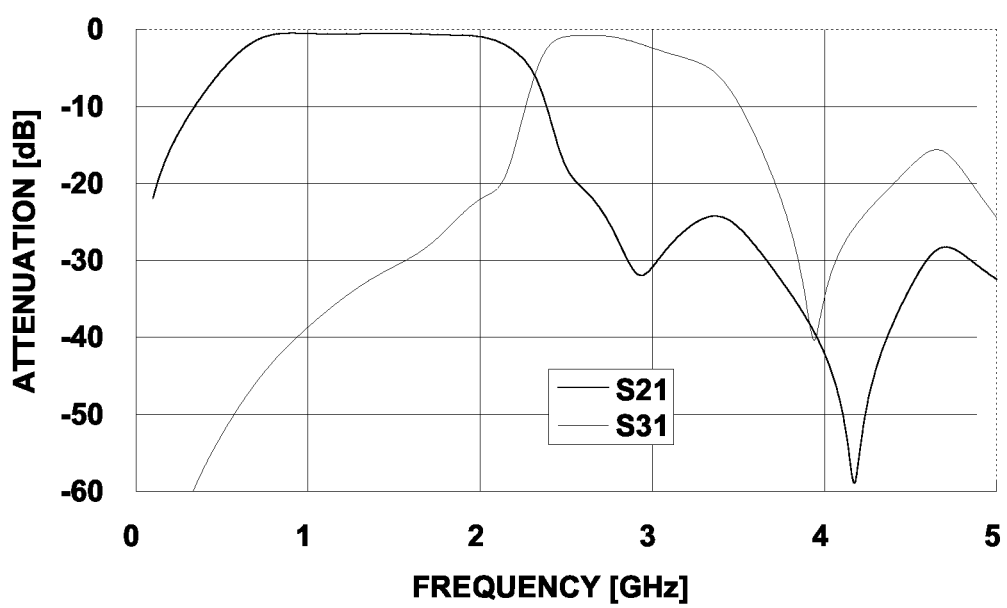
FIG. 11 is a graph illustrating the results of a simulation as to the electric characteristics of the branching filter according to the fifth embodiment of the present invention.

In addition, the results of the simulation as to the electric characteristics of the branching filter according to the fifth embodiment of the present invention, which is illustrated in FIGS. 7 and 8, are illustrated in FIG. 11. According to the graph of FIG. 11, in each of the two transmission characteristics S21 and S31, an attenuation pole was formed at a portion close to the pass band. Therefore, it can be seen that better demultiplexing characteristics could be obtained where changes in the attenuation at portions close to the pass bands were large and the frequency selectivity was good. Thus, the effectiveness of the present invention has been confirmed.

REFERENCE SIGNS LIST

11: input terminal
12a: first output terminal
12b: second output terminal
13a: input-stage resonator
13b: output-stage resonator
14a: first line conductor
14b: second line conductor
15a, 15b, 15c, 15d, 15d, 15e, 15f: capacitor 80: wireless communication module
81: baseband unit
82: RF unit
84: antenna
85: wireless communication device

The invention claimed is:

1. A branching filter comprising:
an input terminal;
a first output terminal;
a second output terminal;
a plurality of resonators that are electromagnetically coupled with each other and that include an input-stage resonator and an output-stage resonator;
a first line conductor having a self-inductance, the first line conductor electromagnetically coupled with the input-stage resonator, the first line conductor connecting the input terminal and the first output terminal;
a first capacitor that connects the first line conductor and ground; and
a second line conductor having a self-inductance, the second line conductor electromagnetically coupled with the output-stage resonator, the second line conductor connected to the second output terminal,
wherein a low-pass filter is composed of the first line conductor and the first capacitor, and a band-pass filter having a pass band in a frequency range outside a pass band of the low-pass filter is composed of the first line conductor, the second line conductor, and the plurality of resonators, and
an electric signal within the pass band of the low-pass filter is output from the first output terminal, and an electric signal within the pass band of the band-pass filter is output from the second output terminal, and
an end of the first line conductor on a side where the first output terminal is disposed side and an open end of the output-stage resonator are directly connected by a second capacitor, and an end of the second line conductor that is not connected to the second output terminal and an open end of the input-stage resonator are directly connected by a third capacitor.

2. A wireless communication module comprising:
an RF unit that includes the branching filter according to claim 1; and
a baseband unit that is connected to the RF unit.

3. A wireless communication device comprising:
an RF unit that includes the branching filter according to claim 1;
a baseband unit that is connected to the RF unit; and
an antenna that is connected to the RF unit.

* * * * *